United States Patent
Klemmer

(10) Patent No.: US 6,856,791 B2
(45) Date of Patent: Feb. 15, 2005

(54) DIRECT AUTOMATIC FREQUENCY CONTROL METHOD AND APPARATUS

(75) Inventor: Nikolaus Klemmer, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 236 days.

(21) Appl. No.: 10/097,314

(22) Filed: Mar. 14, 2002

(65) Prior Publication Data

US 2003/0176173 A1 Sep. 18, 2003

(51) Int. Cl.[7] ................................................ H04B 1/40
(52) U.S. Cl. ...................... 455/76; 455/42; 455/260; 455/113
(58) Field of Search ............................ 455/76, 42, 113, 455/260; 331/1 A; 332/127, 126, 117; 708/101

(56) References Cited

U.S. PATENT DOCUMENTS

| | | | |
|---|---|---|---|
| 4,179,670 A | | 12/1979 | Kingsbury |
| 4,810,977 A | * | 3/1989 | Flugstad et al. ............ 455/113 |
| 4,815,018 A | * | 3/1989 | Reinhardt et al. .......... 708/101 |
| 5,038,117 A | * | 8/1991 | Miller ......................... 455/260 |
| 5,337,024 A | * | 8/1994 | Collins ......................... 455/76 |
| 6,044,124 A | | 3/2000 | Monahan et al. |
| 6,236,275 B1 | | 5/2001 | Dent |
| 6,236,703 B1 | * | 5/2001 | Riley ......................... 331/1 A |
| 6,563,387 B2 | | 5/2003 | Hirano et al. |
| 2002/0010010 A1 | | 1/2002 | Arnaud et al. |

OTHER PUBLICATIONS

Book entitled "Delta-Sigma Data Converters; Theory, Design, and Simulation"; Edited by Steven R. Norsworthy, Richard Schreier, and Gabor C. Temes; IEEE Press; 43 pages.

* cited by examiner

*Primary Examiner*—Edward F. Urban
*Assistant Examiner*—Lana Le
(74) *Attorney, Agent, or Firm*—Coats & Bennett, P.L.L.C.

(57) ABSTRACT

An Automatic Frequency Control (AFC) circuit for a mobile terminal employs a fractional-N Phase Locked Loop (PLL) to directly reduce errors in the synthesized frequency, such as due to component tolerances, temperature drift, and the like. The frequency error is detected by the average speed of rotation of the I,Q constellation. A corresponding offset is added to the tuning frequency selection word prior to encoding, such as in a $\Delta\Sigma$ modulator, to generate an effective non-integer PLL frequency division factor over a specified duration. The $\Delta\Sigma$ modulator may include dithering the different integer values by a pseudo-random number to minimize noise in the output frequency spectrum introduced by the fractional-N division. Component and parameter selection allow a high degree of resolution in frequency control of the fractional-N PLL. By directly controlling for the frequency error, a DAC and XTAL oscillator tuning circuit may be eliminated from the AFC circuit.

8 Claims, 2 Drawing Sheets

DIRECT AUTOMATIC FREQUENCY CONTROL METHOD AND APPARATUS

BACKGROUND OF THE INVENTION

The present invention relates generally to the field of wireless communications and specifically to an improved automatic frequency control circuit and method.

Automatic frequency control (AFC) is a fundamental process for radio communication devices. AFC typically includes one or more phase-locked loop (PLL) circuit(s), which generate a high frequency periodic signal from a low frequency reference signal. AFC is used to perform a wide variety of tasks in wireless communication system components, such as frequency synthesis, AM and FM detection, frequency multiplication, tone decoding, pulse synchronization of signals from noisy sources, and the like, with high frequency accuracy.

One conventional, representative application of AFC, described herein to explicate the present invention, is in conjunction with the downconversion of a received Radio Frequency (RF) signal, such as that produced by the transmitter at a base station, to the baseband frequency in a receiver, such as a wireless communication mobile terminal, for demodulation of the RF signal. The downconversion is accomplished by multiplying (mixing) the RF signal with a high frequency signal (often referred to in the art as a Local Oscillator (LO) frequency signal) to produce sum and difference components. The resulting analog I and Q signals of the difference component (representing the In-phase and Quadrature-phase components, respectively) may be digitized and processed by a baseband processor, such as an appropriately programmed Digital Signal Processor (DSP), to extract information symbols from the signal, as is well known in the art. The LO signal is typically the output of a phase locked loop, which typically uses a high quality crystal (XTAL) oscillator, the frequency of which is multiplied by a programmable factor by the phase locked loop (PLL) circuit.

The residual frequency offset between the actual RF signal and the desired RF frequency (due to the XTAL oscillator frequency error) is an error that should be eliminated or minimized to within an allowable tolerance. This frequency error can be determined in the baseband processor from the speed of rotation of the (I,Q) constellation. This frequency error (in digital representation) is typically converted to an analog voltage by a Digital-to-Analog Converter (DAC) and applied to a frequency control circuit of the XTAL oscillator generating the PLL's reference frequency. In particular, the output voltage of the DAC may be applied to a Variable Capacitance diode (Varicap) through a series of decoupling resistors and capacitors to change the capacitance in the overall resonant circuit, and thereby change the frequency of oscillation slightly. This slight change in the XTAL oscillator circuit output frequency is multiplied by the PLL, resulting in a corresponding change in the local oscillator frequency. The difference between this altered LO frequency and the RF signal is again detected at the baseband processor, and the XTAL oscillator reference frequency again adjusted, in a closed-loop feedback manner. This frequency control loop is commonly referred to as Automatic Frequency Control (AFC).

The voltage level fed back to the XTAL oscillator tuning circuit is not, in general, a direct function of the detected frequency error. Each element in the XTAL oscillator tuning circuit introduces errors due to component tolerance, aging, reflow soldering effects, and the like; furthermore, many of these errors change non-linearly with temperature. Typically, the XTAL oscillator tuning circuit is extensively characterized at the factory, and control voltages to effect various frequency shifts are stored in look-up tables in the baseband processor. Additionally, the baseband processor may dynamically alter or add to the look-up table entries to reflect XTAL oscillator tuning circuit control voltages and associated temperatures and/or other operating characteristics, to build up a more robust error frequency control model over time.

The XTAL oscillator tuning circuit components and DAC add cost to the mobile terminal, consume printed circuit board space, and decrease reliability by providing additional failure points. The extensive characterization of the XTAL oscillator tuning circuit to create initial look-up table entries is time consuming and costly. Finally, the dynamic adaptation of the look-up table entries consumes limited processing resources and adds complexity to the radio control software.

SUMMARY OF THE INVENTION

The present invention relates to a method of automatically controlling an output frequency. The phase difference between a reference frequency and a divided output frequency is detected. The output frequency is generated in response to the phase difference, and error in the output frequency is detected. The output frequency is divided by at least two distinct integer values over a specified duration, the integer values selected in response to the error in the output frequency, to generate the divided output frequency. In this manner, the output frequency is controlled to reduce the error.

In another aspect, the present invention relates to a fractional-N phase locked loop. The fractional-N phase locked loop includes a phase-frequency detector generating a control voltage in response to a reference frequency and a divided output frequency. It also includes a voltage-controlled oscillator generating an output frequency in response to the control voltage. The fractional-N phase locked loop also includes a fractional-N frequency divider generating the divided output frequency from the output frequency, the divided output frequency differing from the output frequency by a non-integer factor over a specified duration. The fractional-N phase locked loop additionally includes an error detector to detect errors in the output frequency and to generate a control signal to control the fractional-N frequency divider to compensate for the error.

DETAILED DESCRIPTION OF THE INVENTION

Figure 1:
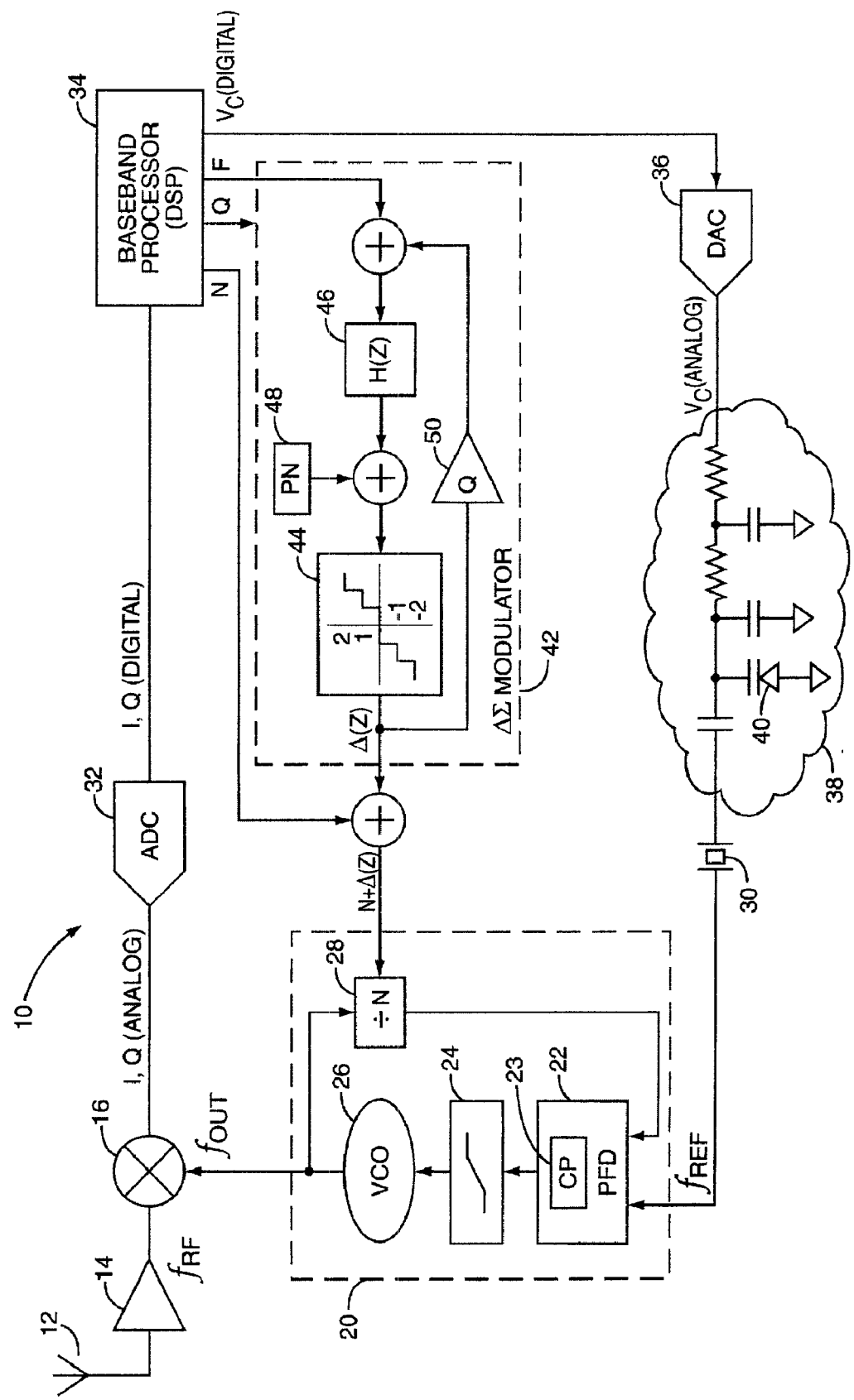
FIG. 1 is a functional circuit diagram of a prior art AFC circuit.

Modern mobile communication terminals use Phase Locked loop (PLL) frequency synthesizers to control the receive and transmit channel frequencies. The general architecture of a PLL-based Automatic Frequency Control (AFC) circuit for downconverting a received RF signal to baseband is depicted in FIG. 1, indicated generally at 10. A transmitted RF signal at frequency $f_{RF}$ is received at antenna 12, amplified by RF low-noise amplifier 14, and mixed with frequency $f_{OUT}$ at mixer 16 (multiple conversion (>1) hetrodyne receivers may include additional downconversion mixers). The frequency $f_{OUT}$ is generated by a Phase Locked loop 20, based on a reference frequency $f_{REF}$ generated by a crystal (XTAL) oscillator 30 and its associated control circuit 38. The mixer 16 outputs sum and difference components ($f_{RF}+f_{LO}$) and ($f_{RF}-f_{LO}$), which are digitized by Analog to Digital Converters (ADC) 32, and processed by a baseband processor 34. The baseband processor 34 detects and extracts information symbols, and detects frequency errors in the baseband signal frequency through the average speed of rotation of symbols in the I,Q constellation, as is known in the art.

The operation of PLL 20 is well understood by those skilled in the art, and is only briefly described herein. The PLL 20 comprises a phase-frequency detector (PFD) 22 that includes a charge pump (CP) 23, a loop filter 24, a Voltage Controlled Oscillator (VCO) 26, and a frequency divider 28. In steady-state condition, the PLL 20 maintains a constant (in most cases zero) average phase difference at the input of the PFD 22. If a phase difference exists between the reference frequency input from the XTAL oscillator 30 ($f_{REF}$) and divided VCO output frequency input ($f_{OUT}/N$), the charge pump 23 issues net charge pulses at its output that get filtered by the loop filter 24. The resulting voltage is applied to the control voltage node of the VCO 26 to generate the desired output frequency ($f_{OUT}$). The frequency divider 28 ensures that in the phase-locked condition:

$$f_{OUT}=N*f_{REF}. \quad (1)$$

As such, drifts in the reference frequency $f_{REF}$ translate directly to errors in the output frequency $f_{OUT}$. For example, a typical reference frequency $f_{REF}$ at the XTAL oscillator 30 may be 20 MHz, with an accuracy of +/−20 parts per million (ppm), or +/−400 Hz. If the division ratio N of frequency divider 28 is 100, the resulting AFC output frequency $f_{OUT}$ is 2 GHz. However, the error of 400 Hz at the XTAL 30, is also multiplied by a factor of 100 in the PLL 20, resulting in an error in the AFC output frequency $f_{OUT}$ of up to +/−40 kHz. The GSM protocol (one wireless communication standard), specifies a channel width of 200 kHz, with an allowed error of +/−0.1 ppm, or +/−200 Hz. In transmit mode, therefore, the system 10 of FIG. 1 is unable, without error control, to generate a transmit frequency signal that complies with the relevant protocol.

One common mode of error control is to compensate for the error by altering the reference frequency $f_{REF}$ of the XTAL oscillator 30 by closing the AFC loop through the DAC 36 and control circuit 38. As described above, the baseband processor 34, upon detecting a frequency error through the average speed of rotation of symbols in the I,Q constellation, may access a look-up table to obtain a digital representation of a control voltage $V_C$. This digital value is output to a Digital-to-Analog Converter (DAC) 36 for conversion to an analog control voltage. The control voltage $V_C$ is applied to a reference frequency correction circuit 38 (including one or more varicaps 40) that alters the effective capacitance seen by the XTAL oscillator 30, correspondingly altering the reference frequency $f_{REF}$. The altered $f_{REF}$ will cause a phase error at PFD 22, and the PLL 20 will adjust the output frequency $f_{OUT}$ accordingly, as described above.

Since the frequency divider 28 and PFD 22 are typically implemented using digital circuitry, the output frequency $f_{OUT}$ can only assume integer multiples of the reference frequency $f_{REF}$ (see equation 1). This in turn limits the minimum frequency step at the VCO 26 output frequency to $f_{REF}$. For a variety of reasons, including locking times, reference spur amplitudes and loop stability, $f_{REF}$ should be generally be chosen as high as possible. A common choice in integer-N synthesizers is therefore $f_{REF}$=channel spacing.

In order to increase the frequency resolution of the PLL 20 to frequency increments below $f_{REF}$, various methods for the implementation of fractional-N frequency synthesizers have been proposed. Generally, these methods make use of the fact that fast changes in the feedback division ratio N (such as once every period of $f_{REF}$) can be averaged by the lowpass response of the PLL 20 itself. As an example, over a duration comprising ten reference cycles, if the division ratio is (N) during seven cycles, and (N+1) during the remaining three cycles, the average non-integer division ratio is (N+0.3). Traditionally, the periodic nature of the changes in the division ratio between N and (N+1) have led to spurious tones in the output spectrum of the PLL 20 that are difficult to suppress. Additionally, the smaller the output frequency step in the fractional-N PLL 20, the higher the number of spurs in the output spectrum. Recently, a number of innovative, all-digital methods have been proposed to implement the timing sequences of changes to the feedback division ratio N in such a way that the impact on the spurious response and phase noise behavior is minimized. One such method is the use of a digital $\Delta\Sigma$ modulator (indicated at 42 in FIG. 1) for the division ratio control.

Generally, the digital $\Delta\Sigma$ modulator 42 functions as an encoder that encodes a fixed or relatively slowly varying number F (the desired tuning frequency, represented by n-bits) into a fast stream of output values $\Delta(z)$. Typically $\Delta(z)$ is represented only by a small number of output bits of the quantizer 44 (in the extreme case only 1-bit). The transfer function 46 of H(z) inside the oversampling $\Delta\Sigma$ loop is chosen such that quantization and dithering noise is shaped towards high frequencies as much as possible. Typically, the quantization noise power spectrum has a maximum at ½ the sampling frequency, which in the PLL 20 application may be conveniently chosen to be equal to the reference frequency $f_{REF}$, although this is not necessary for proper operation. Dithering by a value generated from pseudo-random number generator 48 is generally necessary in cases where the input to the modulator is not moving sufficiently fast to suppress limit cycles in the quantizer output sequence. This is the case in the PLL 20 application, as the input F corresponds to a particular channel number (or frequency) that does not change often. The $\Delta\Sigma$ modulator 42 is designed for a certain modulus Q that can either be programmable or predetermined by design. In essence, the feedback amplifier 50 with a gain of Q provides a means of scaling the output sequence $\Delta(z)$ such that its average assumes the value F/Q. An explanation of the detailed operation of the $\Delta\Sigma$ modulator 42 can be found in J. C. Candy & G. C. Temes, *Oversampling Methods for A/D and D/A Conversion*, in *Oversampling Delta-Sigma Data Converters: Theory, Design and Simulation*, pp. 1–29, IEEE Press, J. Wiley & Sons, 1992, incorporated herein in its entirety.

The output sequence of the $\Delta\Sigma$ modulator 42 is summed together with the integer portion of the desired fractional division ratio N, supplied by the baseband processor 34, to form a sequence of momentary integer division ratios N(z)= N+$\Delta(z)$ that are applied to the feedback divider 28 in the PLL 20. In a similar fashion to an integer PLL 20 as described above, the fractional-N PLL 20 will stabilize at an average zero phase error at the input to the PFD 22 and thereby generate the VCO 26 output frequency:

$$f_{OUT}=f_{REF}*(N+F/Q). \quad (2)$$

In general, $f_{REF}=f_{XTAL}/R$, where $f_{XTAL}$ is the output frequency of the XTAL oscillator 30. However, in most cases R=1 is chosen for the benefit of improved noise shaping. Since the modulus Q of the ΔΣ modulator is an un-restricted design parameter, the frequency step size at the VCO output ($f_{REF}/Q$) can be chosen by design or programmed dynamically.

The AFC circuit 10 of FIG. 1 provides adequate performance, and in particular is able to correct for errors in the AFC output frequency $f_{OUT}$ due to drifts or inaccuracies of the XTAL oscillator 30 via the frequency correction feedback path comprising the DAC 36 and reference frequency correction circuit 38. However, as discussed above, these components add cost, consume board space, reduce reliability, and add computational complexity to the baseband processor 34 by requiring it to dynamically build and maintain a look-up table storing the complex relationship between environmental conditions and the proper frequency control voltage $V_C$ to apply to the reference frequency correction circuit 38.

According to the present invention, the frequency correction feedback path comprising the DAC 36 and reference frequency correction circuit 38 may be omitted entirely, and frequency error control corrected directly by the fractional-N PLL 20. The present invention exploits the fact that the frequency resolution $f_{REF}/Q$ of modern fractional-N PLLs 20 can be chosen almost arbitrarily low by providing a large enough fractional modulus Q, without compromising either the switching speed or the spurious performance of the AFC output signal.

Figure 2:
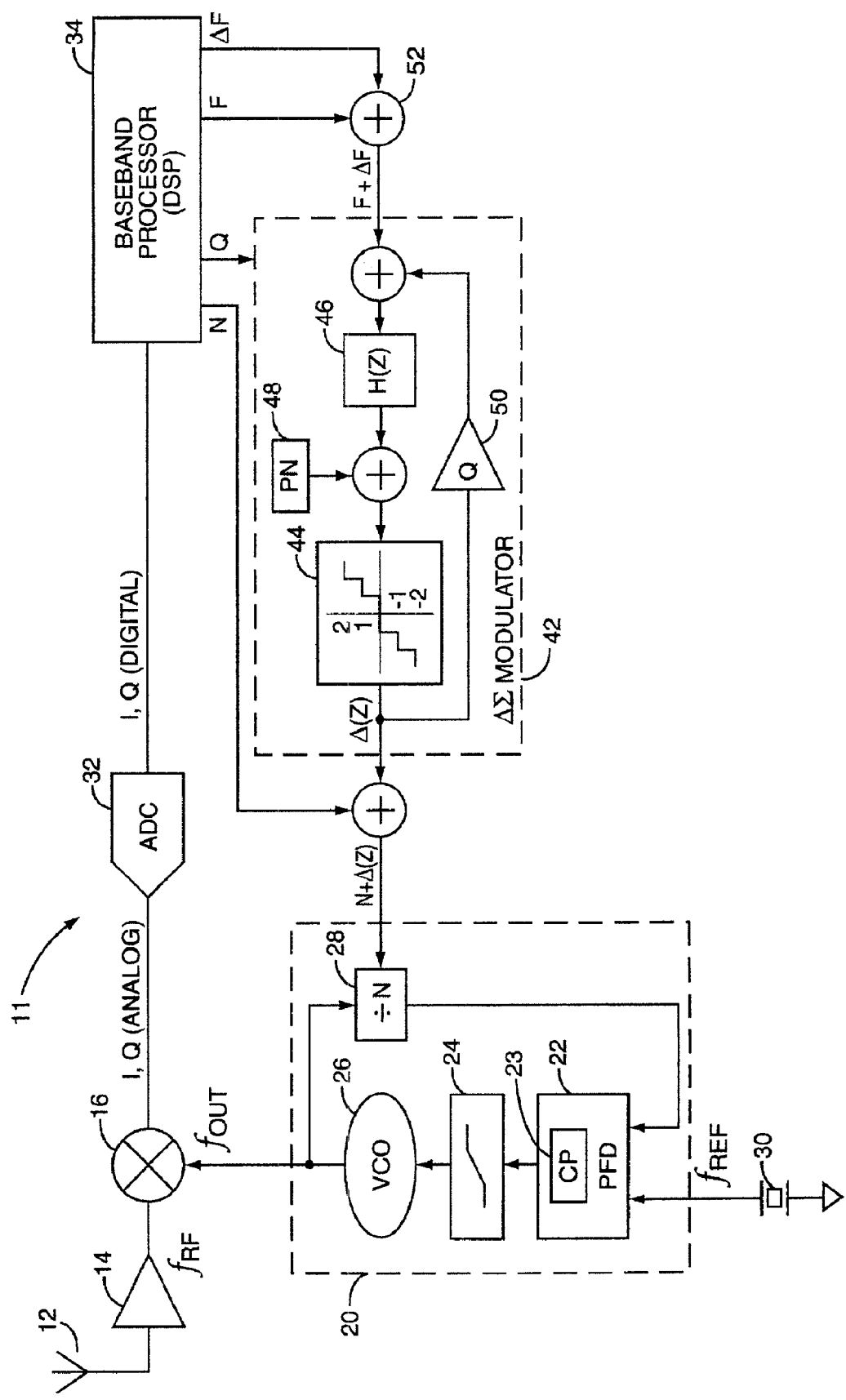
FIG. 2 is a functional circuit diagram of an AFC circuit with direct, fractional-N PLL control of frequency errors.

One implementation of the present invention is depicted in FIG. 2. In the AFC circuit 11, similar to the prior art implementation shown in FIG. 1, the RF input signal at $f_{RF}$ is received at antenna 12 and amplified at low-noise amplifier 14. The signal is downconverted to the baseband by mixing with the output $f_{OUT}$ of the fractional-N PLL 20. The result is converted into the digital domain via ADC 32, and received symbols are extracted from the data stream in the baseband processor 34. The speed of rotation of the I,Q constellation is detected, and a digital frequency-error word ΔF is made available that represents the frequency error in $f_{OUT}$ due to errors in $f_{REF}$. Rather than utilize the detected frequency error to retrieve a control voltage value from a look-up table, covert it to an analog voltage $V_C$, and use $V_C$ to control the output frequency of the XTAL oscillator 30 $f_{XTAL}$, the present invention controls the error directly, utilizing the fractional-N PLL 20 described above.

The baseband processor 34 dynamically generates the parameters (N, F, ΔF). In the AFC circuit 11 of FIG. 2, the output frequency $f_{OUT}$ is given by:

$$f_{OUT}=f_{XTAL}*(N+F/Q+\Delta F/Q),$$

or $$f_{OUT} = f_{XTAL} * \left(N + \frac{F + \Delta F}{Q}\right) \quad (3)$$

The value ΔF, which is used for direct AFC, is calculated from $f_{ERR}$, the frequency difference word available from the speed of rotation detection in the baseband processor 34. $f_{ERR}$ is translated into the PLL 20 frequency correction word ΔF, such that preferably, the rotational frequency of the I,Q constellation vanishes to within the achievable resolution, by:

$$\Delta F=Q*(f_{ERR}/f_{XTAL}). \quad (4)$$

Since the fractional modulus Q of the PLL 20 is known by design, the uncompensated frequency error of the XTAL oscillator 30 is limited to the ppm-level and the PLL 20 frequency error is known from the measurement of the I,Q rotational speed, a one-step AFC correction may be achieved by applying the correction word ΔF to the PLL 20. No tuning of the XTAL oscillator 30 is necessary.

One embodiment of the present invention as outlined above implements equation 4 by use of an adder 52. The adder 52 takes the sum of the channel-setting fractional word (F) and the error-correcting AFC word (ΔF) and applies it to the input of the ΔΣ modulator 42. One of skill in the art will readily recognize, however, that the sum F+ΔF could alternatively be calculated within the baseband processor 34. Additionally, the use of the ΔΣ modulator 42 as a separate component, and the external summation of N+Δ (z) are particular design choices that do not limit the scope of the present invention.

As a quantitative example of the present invention, consider a mobile terminal transmission at 2 GHz, using a XTAL oscillator 30 with a frequency of 20 MHz+/−20 ppm, or 400 Hz, as in the example above. Compliance with the GSM protocol dictates a maximum frequency error of 0.1 ppm, or 200 Hz for a 2 GHz transmission. To achieve this frequency from the 20 MHz XTAL oscillator 30, the fractional division ratio of the frequency divider 28 in the PLL 20 must be ≈100. In this example, for convenience of implementation of the ΔΣ modulator 42, Q may be chosen as $2^{20}$=1,048,576. The minimum uncorrected frequency increment at the PLL 20 output is then 20 MHz/$2^{20}$= 19.07348 Hz. Assuming the GSM channel spacing of 200 kHz, the increment in the fractional portion of the division ratio F from one channel to the next is ROUND (200 kHz/19.07348 Hz)=10,486. The frequency error correction word ΔF as determined from the AFC algorithm is then added to this number and updated as necessary to minimize the frequency error.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of automatically stabilizing an output frequency, comprising:

detecting the phase difference between a reference frequency and a divided output frequency;

generating said output frequency in response to said phase difference;

detecting a deviation from a desired, stable frequency in said output frequency;

dividing said output frequency by at least two distinct integer values over a specified duration, said integer values selected in response to said deviation in said output frequency, to generate said divided output frequency;

whereby said output frequency is controlled to reduce said deviation from said desired, stable frequency without altering said reference frequency.

2. The method of claim 1 wherein dividing said output frequency by at least two distinct integer values over a specified duration comprises selectively dividing said output frequency by at least two distinct integer values over said specified duration so as to effectively divide said output frequency by a non-integer value over said duration.

3. The method of claim 2 further comprising selecting the sequence of said two distinct integer values over said duration in a pseudo-random manner.

4. The method of claim 1 further comprising filtering said output frequency to remove modulation in said output frequency introduced by dividing said output frequency by said at least two distinct integer values over said specified duration.

5. A fractional-N phase locked loop, comprising:
  a phase-frequency detector generating a control voltage in response to a reference frequency and a divided output frequency;
  a voltage-controlled oscillator generating an output frequency in response to said control voltage;
  a fractional-N frequency divider generating said divided output frequency from said output frequency, said divided output frequency differing from said output frequency by a non-integer factor over a specified duration; and
  an error detector to detect deviation from a desired, stable frequency in said output frequency and to generate a control signal to control said fractional-N frequency divider to reduce said deviation without altering said reference frequency.

6. The fractional-N phase locked loop of claim 5, wherein said fractional-N frequency divider includes a delta-sigma modulator.

7. The fractional-N phase locked loop of claim 5, wherein said fractional-N frequency divider outputs a sequence of at least two integer divider factors, the number of each of said integer divider factors over said specified duration selected so as to yield an effective non-integer divider factor said specified duration.

8. The fractional-N phase locked loop of claim 7, wherein said fractional-N frequency divider further comprises a pseudo-random number input, and wherein the sequence of integer divider factors generated by said fractional-N frequency divider over said specified duration is determined by said pseudo-random number.

* * * * *